(12) United States Patent
Irsigler et al.

(10) Patent No.: US 7,829,380 B2
(45) Date of Patent: Nov. 9, 2010

(54) SOLDER PILLAR BUMPING AND A METHOD OF MAKING THE SAME

(75) Inventors: Roland Irsigler, München (DE); Harry Hedler, Germering (DE)

(73) Assignee: Qimonda AG, Munich (DE)

(*) Notice: Subject to any disclaimer, the term of this patent is extended or adjusted under 35 U.S.C. 154(b) by 498 days.

(21) Appl. No.: 11/589,986

(22) Filed: Oct. 31, 2006

(65) Prior Publication Data

US 2008/0099925 A1    May 1, 2008

(51) Int. Cl.
    *H01L 21/00* (2006.01)
(52) U.S. Cl. ........................ 438/108; 257/778
(58) Field of Classification Search .......... 438/108; 257/778
    See application file for complete search history.

(56) References Cited

U.S. PATENT DOCUMENTS

| 5,747,101 A * | 5/1998 | Booth et al. ............... 438/460 |
| 6,495,916 B1 * | 12/2002 | Ohuchi et al. .............. 257/737 |
| 6,683,379 B2 * | 1/2004 | Haji et al. .................. 257/729 |
| 2006/0180940 A1 * | 8/2006 | Kirby et al. ................ 257/774 |
| 2006/0261493 A1 * | 11/2006 | Boon ......................... 257/778 |

FOREIGN PATENT DOCUMENTS

JP             01144653      *    6/1989

\* cited by examiner

*Primary Examiner*—Matthew C Landau
*Assistant Examiner*—James M Mitchell
(74) *Attorney, Agent, or Firm*—Patterson & Sheridan, LLP

(57) ABSTRACT

A method of forming flip chip bumps includes forming a plurality of metallization pads on a die. In another step, a structured layer having pores is formed on the die and metallization pads where the pads on the die are exposed through the pores. In yet another step, the die is transferred to a chamber having a liquid metal bath. In another step, a first pressure is created within the chamber followed by dipping the die in the liquid metal bath. In another step, a second pressure is created within the chamber such that liquid metal fills portions of the pores thereby forming metal pillars connected to the pads.

70 Claims, 9 Drawing Sheets

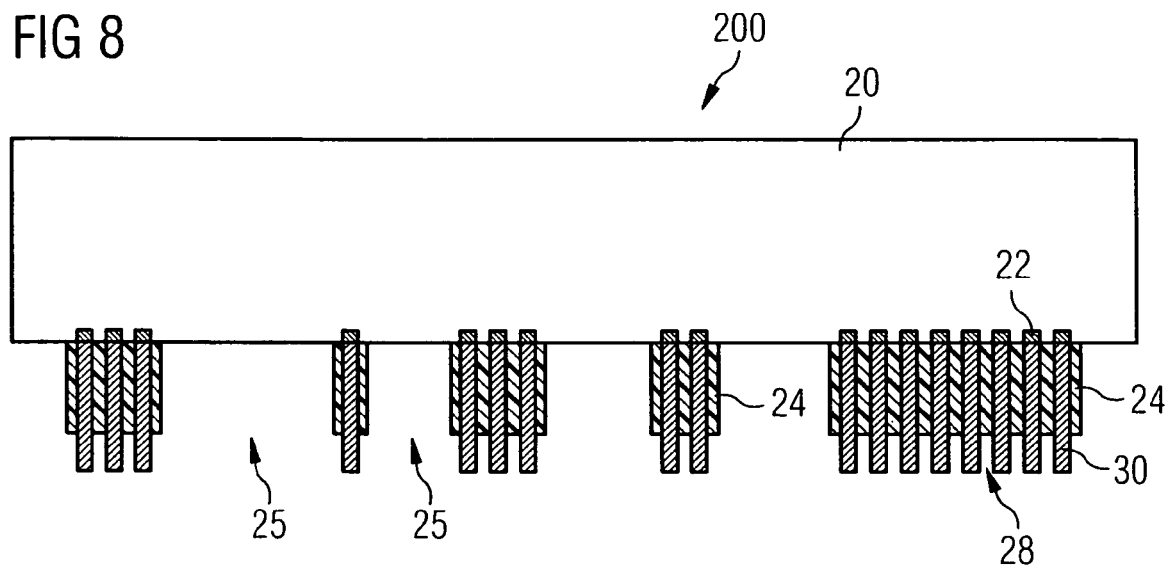
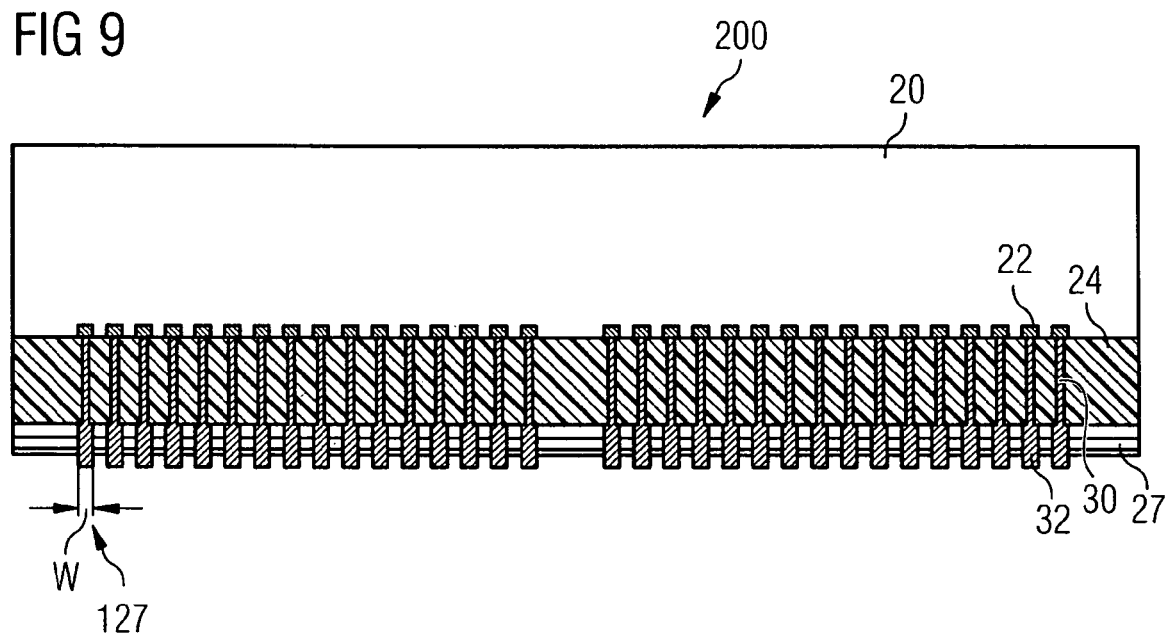

SOLDER PILLAR BUMPING AND A METHOD OF MAKING THE SAME

TECHNICAL FIELD OF THE INVENTION

The invention relates to solder pillar bump interconnections for semiconductor devices, and in particular, to pillar connections from a semiconductor chip to a substrate with a high aspect ratio and a method for making such connections.

BACKGROUND OF THE INVENTION

One method of integrated circuit interconnection is called flip-chip bonding. Here bumps of solder or other conductive material are deposited onto conductive pads of a semiconductor wafer or chip. After separation of individual dies from the wafer the individual dies or chips are turned upside down and a bumps are properly align with a metallization pattern on another substrate. The aligned bumps are then join to appropriate points on the pattern.

Conventional interconnect methods employed lead base solders for connecting flip-chips to substrates. As the structural dimensions of electronic devices get smaller the use of sphere shaped solder bumps is disadvantageous because it may be difficult to achieve a fine pitch between adjacent interconnects without bridging which causes electrical shorting. Therefore it is desirable to provide an improved interconnect system to achieve finer pitch with minimum probability of bump bridging period.

The increasing demand for integration generally requires much more dense interconnects between chip to substrate as well as between chip to chip. The conventional solder bump plating technology is the technology of choice for pitches greater than 80 microns. For finer pitches and larger interconnect densities, pillar bumps are the preferred solution. Some potential advantages of that pillar geometry allows a finer pitch interconnect compared to the conventional solder sphere technology. The risk of shorts occurring between bumps during fabrication and flip-chip assembly, such as during electroplating or printing and reflow, is reduced for copper pillar bumps.

Moreover, copper pillar bumps may have a larger stand off compared to solder bumps. This may be a benefit during the underfill process. Less restrictions exist for underfill materials or processes, for example small filler size or capillary underfilling and underfill molding respectively. In addition, due to the larger stand off of copper pillar bumps stress at the chip bump interfaces is reduced due to the higher aspect ratio and higher flexibility of the interconnect element. In particular this becomes important when fragile low k interlayer dielectrics are used. The present invention seeks to alleviate some of the outlaying problems and proposes an economic solution to fabricate bumps with a large pitch and also fine pitch at a low cost.

The known fine pitch bumping technologies, for example solder bumping or copper pillar bumping have the disadvantage that bumps are typically grown by electroplating at relatively low rates, for example at approximately 3 µm/min. This results in very high production costs. In electroplating the uniformity is restricted across the wafer that is greater than 10%. Different diameters of the bumps at the same height are only possible by copper pillar technology. The different feature sizes increase the non-uniformity of copper plating. Special bump area geometries such as bump lines, small rectangular arrays and square arrays can result in different bump heights due to the different current density in electroplating.

SUMMARY OF THE INVENTION

The present invention provides an improved process for fabricating solder pillar bumps and copper pillar bumps. According to one embodiment of the present invention, there is a method of forming a flip-chip bump is disclosed wherein the method includes steps as described in the following. In an initial step, a plurality of metallization pads are formed on a die. In another aspect, a structured layer having pores is formed on the die and metallization pads where the pads on the die are exposed through the pores. In yet another aspect, the die is transferred to a chamber having a liquid metal bath. In another aspect, a first pressure is created within the chamber followed by dipping the die in the liquid metal bath. In another aspect, a second pressure is created within the chamber such that liquid metal fills portions of the pores thereby forming metal pillars connected to the pads.

According to another embodiment of the present invention, there is a method of assembling a semiconductor package is disclosed wherein the method includes steps as described in the following. In an initial aspect, a plurality of metallization pads are formed on a die. In another aspect, a structured layer having pores is formed on the die and metallization pads where the pads on the die are exposed through the pores. In yet another aspect, the die is transferred to a chamber having a liquid metal bath. In another aspect, a first pressure is created within the chamber followed by dipping the die in the liquid metal bath. In another aspect, a second pressure is created within the chamber such that liquid metal fills portions of the pores thereby forming metal pillars connected to the pads. In another aspect, the structured layer is removed. In yet another aspect, the die is placed on a second component having a solder depot on a plurality of metallization pads such that the metal pillars are aligned with the solder depots. In another aspect, the metal pillars are connected to the solder depots.

According to another embodiment of the present invention, there is a method of assembling a semiconductor package is disclosed wherein the method includes steps as described in the following. In an initial aspect, a plurality of metallization pads are formed on a die. In another aspect, a structured layer having pores is formed on the die and metallization pads where the pads on the die are exposed through the pores. In yet another aspect, the die is transferred to a chamber having a liquid metal bath. In another aspect, a first pressure is created within the chamber followed by dipping the die in the liquid metal bath. In another aspect, a second pressure is created within the chamber such that liquid metal fills portions of the pores thereby forming metal pillars connected to the pads. In another aspect, a solder sphere is formed on an end of the metal pillar. In yet another aspect, the die is placed on a second component having a plurality of metallization pads such that the solder spheres are aligned with the metallization pads of the second component. In another aspect, the solder spheres are connected to the metallization pads of the second component.

According to another embodiment of the present invention, there is a method of assembling a semiconductor package is disclosed wherein the method includes steps as described in the following. In an initial aspect, a plurality of metallization pads are formed on a die. In another aspect, a structured layer having pores is formed on the die and metallization pads where the pads on the die are exposed through the pores. In yet another aspect, the die is transferred to a chamber having a liquid metal bath. In another aspect, a first pressure is created within the chamber followed by dipping the die in the liquid metal bath. In another aspect, a second pressure is created within the chamber such that liquid metal fills portions of the pores thereby forming metal pillars connected to the pads. In another aspect, portions of the structured layer are removed such that both a portion of the metal pillars is exposed. In yet another aspect, the die is placed on a second component having a plurality of metallization pads such that the metal pillars are aligned with the metallization pads of the second component. In another aspect, the metal pillars are connected to the metallization pads of the second component.

According to another embodiment of the present invention, there is an integrated circuit device is disclosed wherein the integrated circuit device includes a die having metallization pads. A plurality of metal pillars are connected to the pads wherein the aspect ratio of the metal pillars is at least about 1.

According to another embodiment of the present invention, there is a semiconductor package is disclosed wherein the semiconductor package includes a die having metallization pads. A plurality of metal pillars are connected to the pads wherein the aspect ratio of the metal pillars is at least about 1. The semiconductor package also includes a second component having a plurality of metallization pads connected to the metal pillars.

BRIEF DESCRIPTION OF THE DRAWINGS

The above recited features of the present invention will become clear from the following description taken in conjunction with the accompanying drawings in which like reference numerals identify like elements. It is to be noted however that the accompanying drawings illustrate only typical embodiments of the present invention and are therefore not to be considered limiting of the scope of the invention. The present invention may admit equally effective embodiments. The present invention will be described below in more details with reference to the embodiments and drawings.

FIG. 8 shows a diagrammatic cross-sectional view of an integrated circuit device according to one embodiment of the present invention.

FIG. 9 shows a diagrammatic cross-sectional view of an integrated circuit device according to one embodiment of the present invention.

DETAILED DESCRIPTION OF THE INVENTION

Reference will now be made in detail to the embodiments of the invention, examples of which are illustrated in the accompanying drawings. Wherever possible, the same reference numbers will be used throughout the drawings to refer to the same or like parts.

Figure 1:
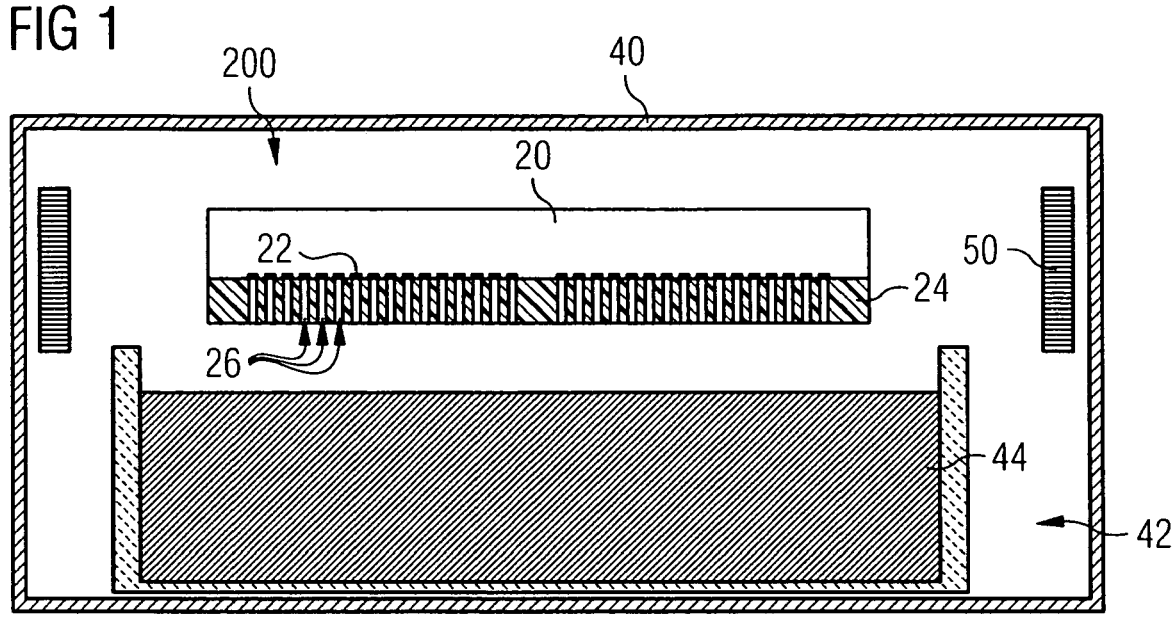
FIG. 1 shows a diagrammatic cross-sectional view of a method of forming a flip chip bump according to one embodiment of the present invention.

The present invention provides a method of forming a flip chip bump on an integrated circuit device 200. Turning to FIG. 1, a diagrammatic cross-sectional view of a method of forming a flip chip bump according to one embodiment of the present invention is shown. According to one aspect of the present invention a method of forming a flip-chip bump is disclosed wherein the method includes steps as described in the following. In an initial step, a plurality of metallization pads 22 are formed on a die 20. The die may be a semiconductor die or wafer made of glass, ceramic or polymer. In another step, a structured layer 24 having pores 26 is formed on the die 20 and metallization pads 22 where the pads on the die 20 are exposed through the pores 26. The metallization pads may comprise at least on of the following materials: copper (Cu), nickel (Ni), gold, (Au), and aluminum (Al).

The structured layer 24 may be formed and defined according to another aspect of the invention though the individual steps are not shown in FIG. 1. In an initial step, the structured layer 24 may be formed by forming a layer of photosensitive material on the die 20 and metallization pads 22. Next, the layer of photosensitive material is exposed to radiation at predetermined areas corresponding to the pads 22 followed by removing portions of the layer that are exposed to radiation to form pores 26 in the layer, thereby exposing the pads 22 on the die 20 through the pores 26 as shown in FIG. 1. These steps may be performed using lithography and development processes—of the photosensitive material. It may also include a dry etch process to define the pores, if the layer 24 is not a photosensitive material. The structured layer may comprise at least one of the following material epoxy based photoresist (e.g. Nano™SU-8 from Micro-Chem), resist (e. g. THB-51N from JSR), silicone backbone resist, PMMA, benzocyclobutene (BCB) and silica.

Figure 2:
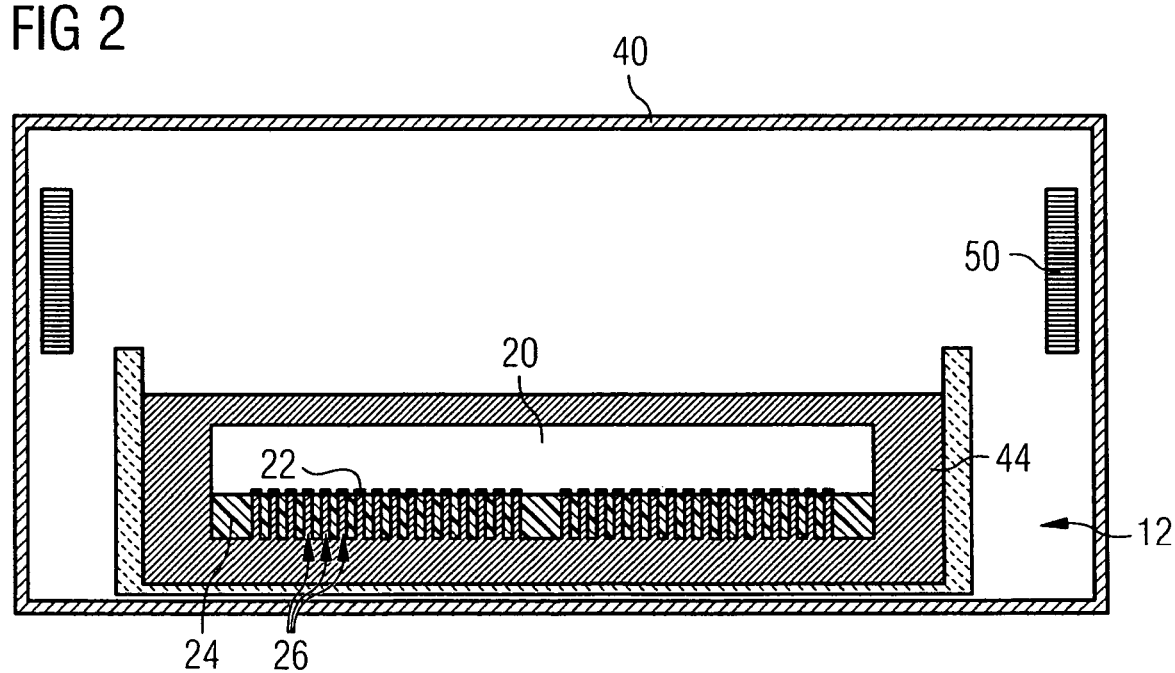
FIG. 2 shows a diagrammatic cross-sectional view of a method of forming a flip chip bump according to one embodiment of the present invention.

Continuing to form the flip chip bump may be carried out according to the steps as follows. In another step according to one aspect of the invention, the die 20 is transferred to a chamber 40 having a liquid metal bath 42. In another step, the semiconductor 20 may be preheated to a desired temperature such as using heaters 50 within the chamber 40. In another step, a first pressure is created within the chamber 40 as shown in FIG. 1 followed by dipping the die 20 in the liquid metal bath 42 as shown in FIG. 2. The die may be horizonal or vertical or at any other angle dipped into the liquid metal bath. The first pressure may be lower than the original ambient chamber pressure thereby creating a vacuum effect within the chamber. It is believed that a vacuum effect will remove much of the ambient air within the pores 26 thereby facilitating filling the pores with liquid metal 44. The liquid metal and thus the metal pillars may comprise at lease one of the following materials: tin (Sn), lead (Pb), copper (Cu), silver (Ag), bismuth (Bi), indium (In), and antimony (Sb).

Figure 3A:
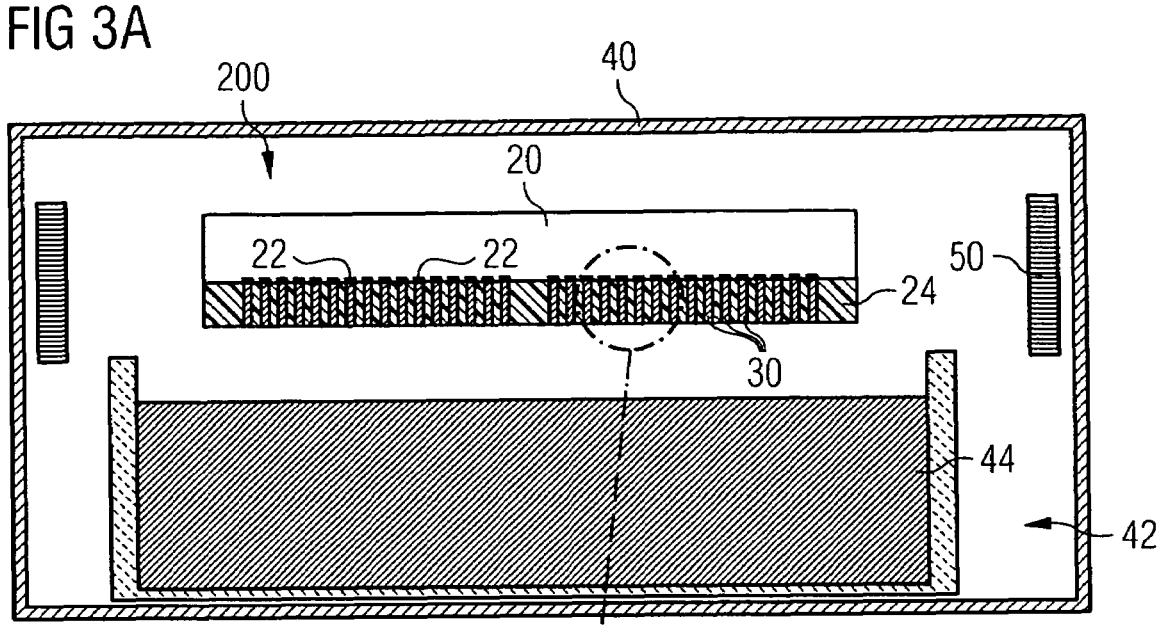
FIG. 3A shows a diagrammatic cross-sectional view of a method of forming a flip chip bump according to one embodiment of the present invention.

In another step, a second pressure is created within the chamber 40 such that liquid metal 44 fills portions of the pores 26 thereby forming a metal pillar 30 connected to the pads 22. The second pressure is a different pressure than the first pressure and may be greater than the first pressure. It is believed that increasing the chamber pressure while the pores 26 are immersed in the liquid metal bath 42 will also facilitate substantially filling the pores 26 with liquid metal 44 and thereby forming a liquid metal pillar 30 with minimal porosity. The die 20 is then removed from the liquid metal bath 42 as shown in FIG. 3A.

One possible advantage of the present invention is the ability to form fine pitch solder bumps and solder bumps with high aspect ratios. The aspect ratio represents the ratio between the height 130 and the width 135 of the metal pillar. By using the inventive method to form solder bumps, the metal pillar aspect ratio may be at least 1, at least 5, and maybe as high as at least 10. In another step, the method may include removing the structured layer as will be shown in later Figures. In yet another step, the method may include planarizing the combined layer of metal pillars and structured layer. Planarizing may be achieved using mechanical, chemical mechanical planarization or CMP processes. Generally, planarization processes are used to polish the surface of a semiconductor wafer, die, or other type of surface.

Figure 3B:
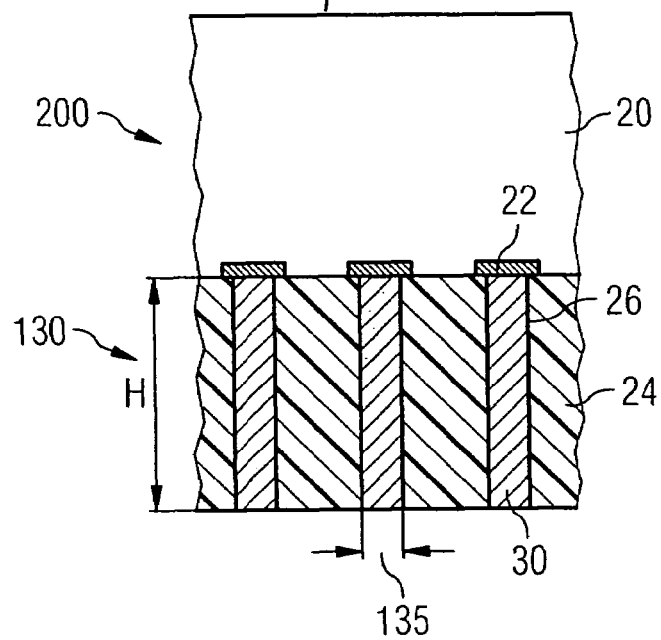
FIG. 3B shows a close up view of a diagrammatic cross-section of an integrated circuit device according to one embodiment of the present invention.

Turning to FIG. 3B, a close up view of a diagrammatic cross-section of an integrated circuit device 200 according to one embodiment of the present invention is shown. A plurality of metal pillars 30 are formed according to the present invention. The metal pillars 30 are connected to a plurality of metallization pads 22 on the die 20. According to another aspect of the present invention an integrated circuit device 200 is formed wherein the integrated circuit device 200 includes a die 20 having metallization pads 22. A plurality of metal pillars 30 are connected to the pads wherein the aspect ratio of the metal pillars is at least about 1. Although, the aspect ratio of the metal pillars 30 on the integrated circuit device 200 may be at least about 5 or at least about 10.

Figure 4A:
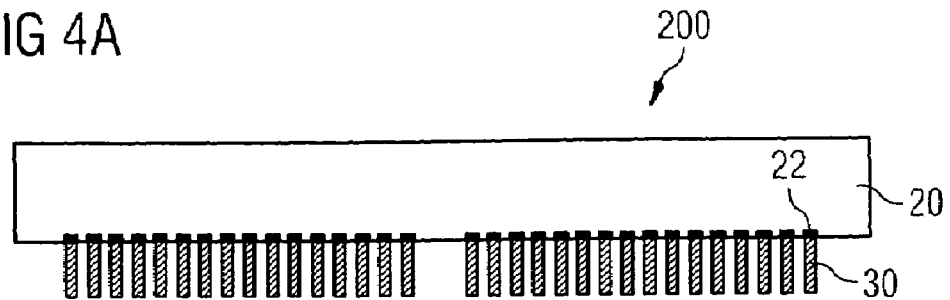
FIGS. 4A-4D show diagrammatic cross-sectional views of a method of assembling a semiconductor package according to one embodiment of the present invention.

FIGS. 4A-4D show diagrammatic cross-sectional views of a method of assembling a semiconductor package 100 according to one embodiment of the present invention. FIG. 4A shows an integrated circuit device 200 including a die 20 having metallization pads 22 and metal pillars 30. According to another aspect of the present invention a method of assembling a semiconductor package is disclosed wherein the method includes steps as described in the following. The die 20 in FIG. 4A is formed according to the following steps and shown in the previous Figures. In an initial step, a plurality of metallization pads 22 are formed on a die 20. In another step, a structured layer 24 having pores 30 is formed on the die 20 and metallization pads 22 where the pads on the die 20 are exposed through the pores 26. In yet another step, the die is transferred to a chamber 40 having a liquid metal bath. In another step, a first pressure is created within the chamber 40 followed by dipping the die 20 in the liquid metal bath 42. In another step, a second pressure is created within the chamber such that liquid metal 44 fills portions of the pores 26 thereby forming metal pillars 30 connected to the pads 22. In another step, the structured layer 24 is removed leaving the metal pillars 30. By using the inventive method to form solder bumps, the metal pillar aspect ratio may be at least 1, at least 5, and maybe as high as at least 10.

Other steps in the process may include preheating the die to a desired temperature and planarizing the combined layer of metal pillars and structure layer before attaching the die 20 to a second component 120. The structured layer 24 may also be formed according to anther aspect of the invention though the individual steps are not shown in FIGS. 4A-4D. In an initial step, the structured layer 24 may be formed and defined by forming a layer of photosensitive material on the die 20 and metallization pads 22. Next, the layer of photosensitive material is exposed to radiation at predetermined areas corresponding to the pads 22 followed by removing portions of the layer that are exposed to radiation to form pores 26 in the layer, thereby exposing the pads 22 on the die 20 through the pores 26 as shown in FIG. 1. These steps may be performed using lithography, development or dry etch of the photosensitive material. The structured layer may comprise at least one of the following material epoxy based photoresist (e.g. Nano™SU-8 from Micro-Chem), polymer resist (e. g. THB-51N from JSR), silicone backbone resist, PMMA, benzocyclobutene (BCB) and silica.

Figure 4B:
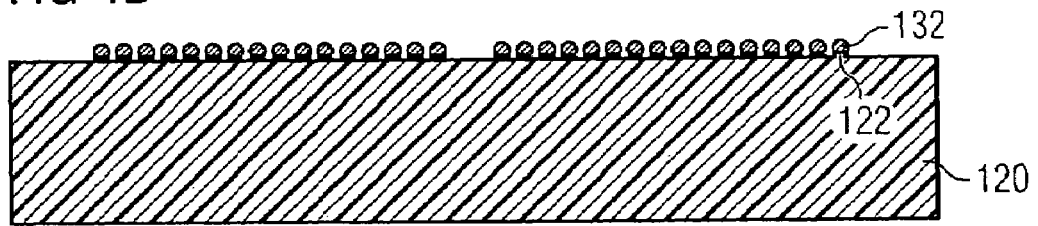
Figure 4C:
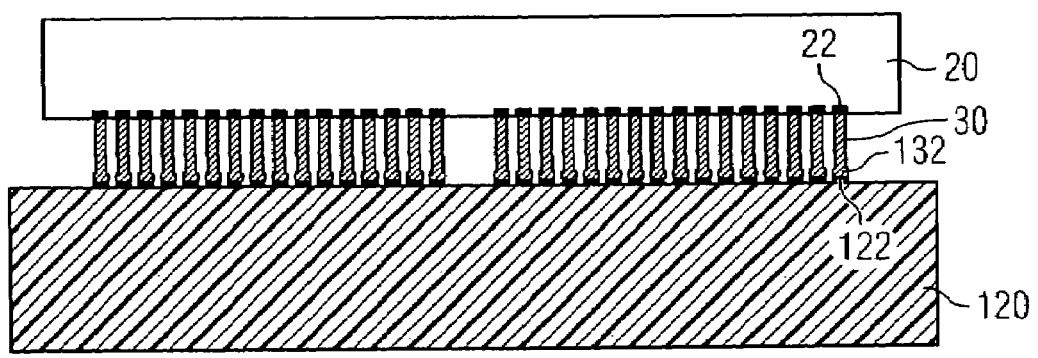
Figure 4D:
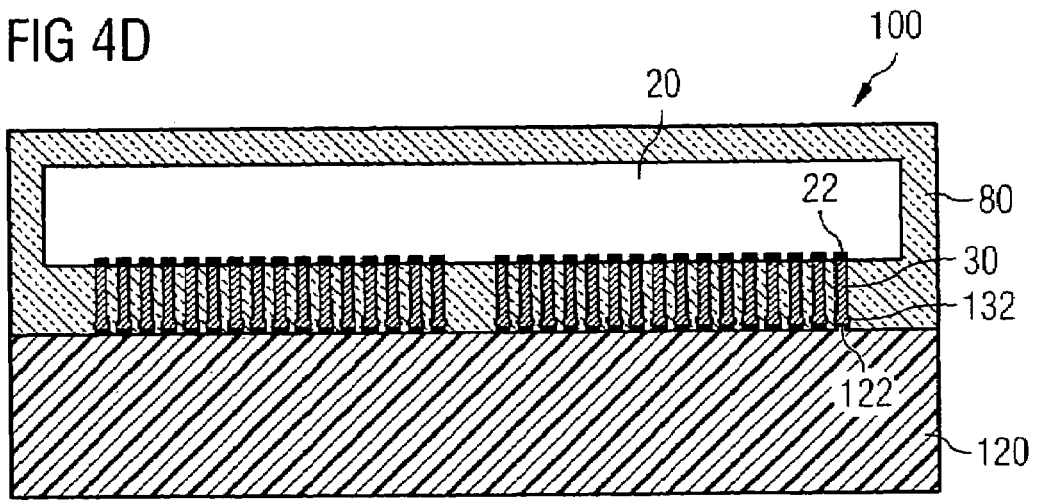

In yet another step as shown in FIG. 4B, the die 20 is placed on a second component 120 having a solder depot or solder covered pad 132 on a plurality of metallization pads 122 such that the metal pillars 30 are aligned with the solder covered pads 132. Sometimes this procedure may be referred to as a "pick & place" method. In another step as shown in FIG. 4D, the metal pillars 30 are connected to the solder covered pads 132. Connecting the metal pillars 30 to the covered pads 132 may be accomplished with various methods, one example of which is a reflow process. The solder covered pads 132 on the metallization pads 122 of the second component 120 may have a lower melting point than the metal pillars 30. Another step may include encapsulating the die 20 thereby forming an encapsulant 80 as shown in FIG. 4D. Other alternatives steps may include forming an undermold between the die and the second component. Another alternative step may include forming a liquid underfill between the die and the second component. These alternatives are shown in FIGS. 10A-10C and FIG. 11. Furthermore, the second component 120 may comprise a substrate or another die.

According to another aspect of the present invention a semiconductor package 100 is disclosed in FIG. 4D wherein the semiconductor package 100 includes a die 20 having metallization pads 22. A plurality of metal pillars 30 are connected to the pads 22 wherein the aspect ratio of the metal pillars 30 is at least about 1. The semiconductor package 100 also includes a second component 120 having a plurality of metallization pads 122 connected to the metal pillars 30.

Figure 5A:
FIGS. 5A-5F show diagrammatic cross-sectional views of a method of forming a flip chip bump, including a close up view, according to one embodiment of the present invention.
Figure 5B:
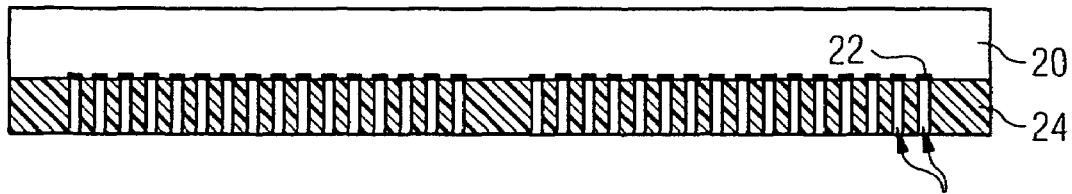
Figure 5C:
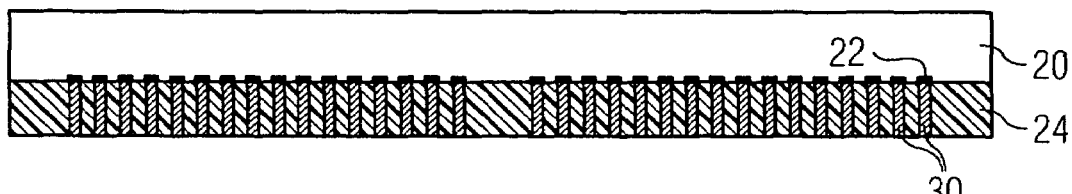
Figure 5D:
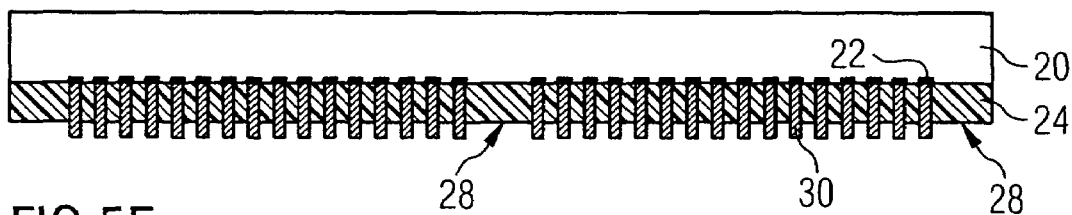
Figure 5E:
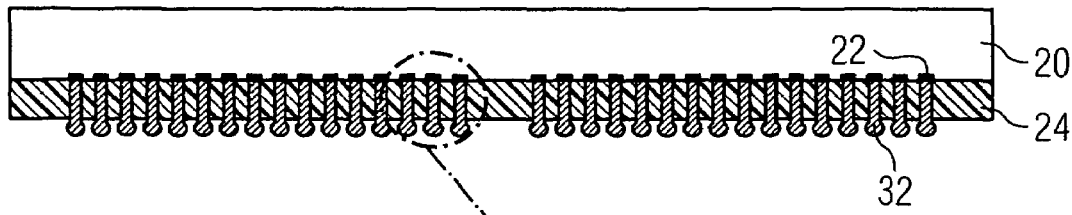
Figure 5F:
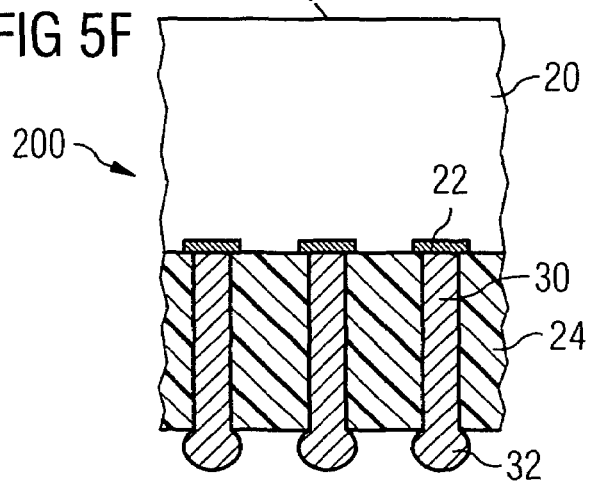

FIGS. 5A-5F show diagrammatic cross-sectional views of a method of forming a flip chip bump on an integrated circuit device 200, including a close up view, according to one embodiment of the present invention. A plurality of metallization pads 22, as shown in FIG. 5A, is formed on a die 20. A structured layer 24 having pores 26 is formed on the die 20 and metallization pads 22 as shown in FIG. 5B. Metal pillars 30, as shown in FIG. 5C, are formed according to the same method as described above in FIGS. 1-3B. Other alternative steps may also be subsequently performed on the die 20 when forming flip chip bumps as shown in FIGS. 5D-5F. For example, the inventive method may also include the steps of removing portions 28 of the structured layer 24 such that a corresponding portion of the metal pillars 30 is exposed as shown in FIG. 5D. A wet or dry etch process may be used to remove portions of the structured layer though the removal process will depend on the type of material from which the structured layer is made.

FIG. 5E shows a solder sphere 32 on an end of the exposed metal pillars 30. Solder spheres may be formed by any process used to form solder spheres such as a solder reflow process which generates a micro-sphere. Turning to FIG. 5F, a close up view of a diagrammatic cross-section of a flip chip bump according to one embodiment of the present invention is shown. A plurality of metal pillars 30 are formed according to the present invention. The metal pillars 30 are connected to a plurality of metallization pads 22 on the die 20. Solder bumps 32 are formed on the end of the metal pillars 30. The liquid metal and thus the metal pillars may comprise at lease one of the following materials: tin (Sn), lead (Pb), copper (Cu), silver (Ag), bismuth (Bi), indium (In), and antimony (Sb). For example, in this step the metal may comprise a eutectic alloys such as SnAgCu or PbSn.

Figure 6A:
FIGS. 6A-6G show diagrammatic cross-sectional views of a method of forming a flip chip bump, including a close up view, according to one embodiment of the present invention.
Figure 6B:
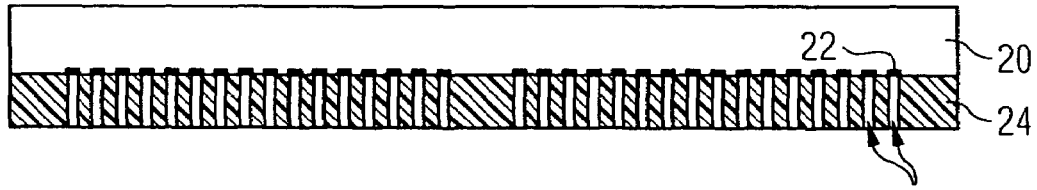
Figure 6C:
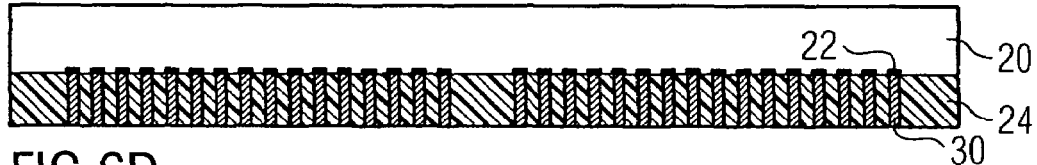
Figure 6D:
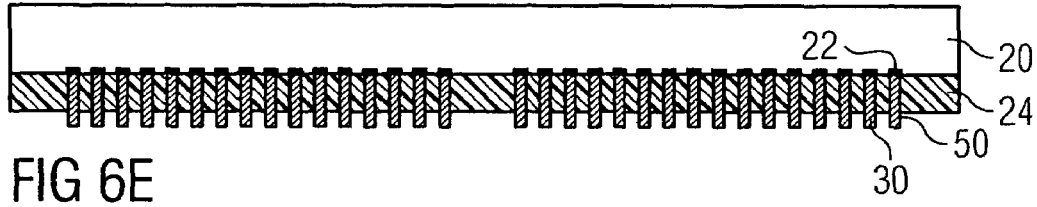

FIGS. 6A-6G show diagrammatic cross-sectional views of a method of forming a flip chip bump on an integrated circuit device 200, including a close up view, according to one embodiment of the present invention. A plurality of metallization pads 22, as shown in FIG. 6A, is formed on a die 20. A structured layer 24 having pores 26 is formed on the die 20 and metallization pads 22 as shown in FIG. 6B. Metal pillars 30, as shown in FIG. 6C, are formed according to the same method as described above in FIGS. 1-3B. Other alternative steps may also be subsequently performed on the die 20 when forming flip chip bumps as shown in FIGS. 6D-6G. For example, the inventive method may also include the steps of forming a low melting point solder cap 50 on the metal pillars 30 as shown in FIG. 6D. The solder cap 50 may be formed using any process that forms a solder cap such as by printing, dip, or electroplating processes.

Figure 6E:
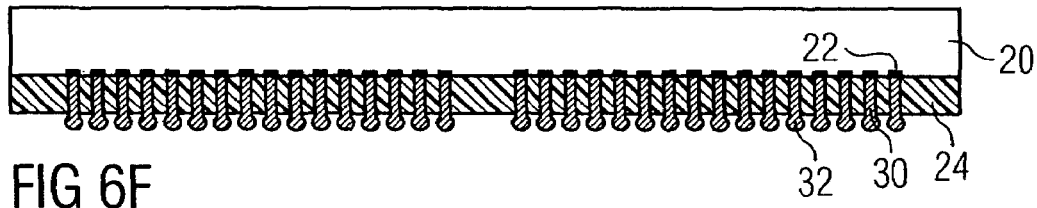
Figure 6F:
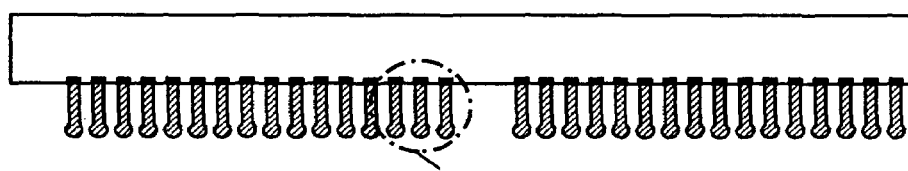
Figure 6G:
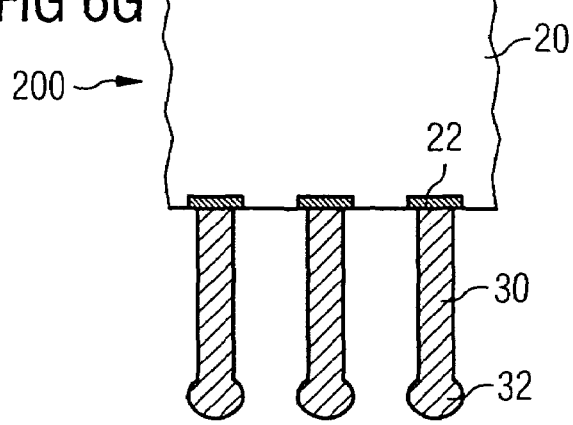

FIG. 6E shows a solder sphere 32 on an end of the exposed metal pillars 30 formed by melting the solder cap 50 to form the solder sphere 32. Solder spheres may be formed by any process used to form solder spheres such as a solder reflow process which generates a micro-sphere. The structured layer 24 is then removed as shown in FIG. 6F. The structured layer may be removed using stripping or etching processes. FIG. 6G shows a close up view of a diagrammatic cross-section of a flip chip bump according to one embodiment of the present invention. A plurality of metal pillars 30 are formed according to the present invention. The metal pillars 30 are connected to a plurality of metallization pads 22 on the die 20. Solder bumps 32 are formed on the end of the metal pillars 30. The liquid metal and thus the metal pillars may comprise at least one of the following materials: tin (Sn), lead (Pb), copper (Cu), silver (Ag), bismuth (Bi), indium (In), and antimony (Sb). For example in this step, the metal may comprise an alloy such as SnPb (10/90) or SnAg (97,5/2,5) whereas the solder cap may comprise a low melting point alloy such as SnAgBi (96,7/3,5/4,8).

Figure 7A:
FIGS. 7A-7E show diagrammatic cross-sectional views of a method of forming a flip chip bump according to one embodiment of the present invention.
Figure 7B:
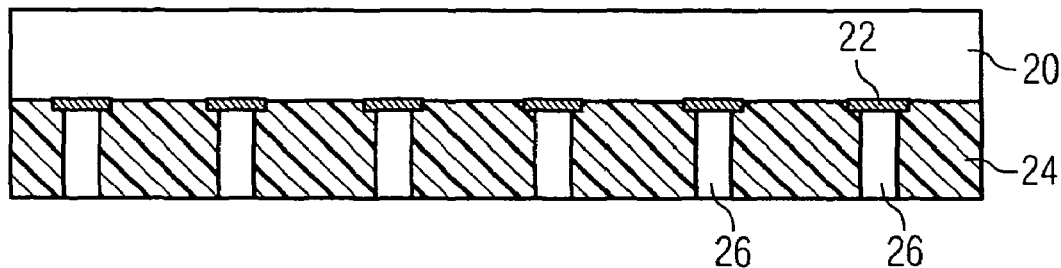
Figure 7C:
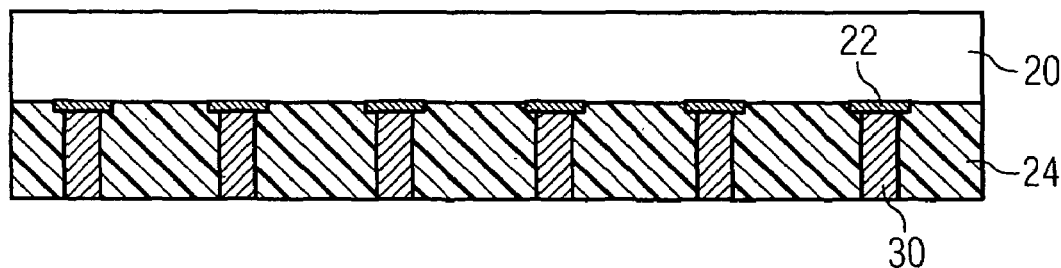
Figure 7D:
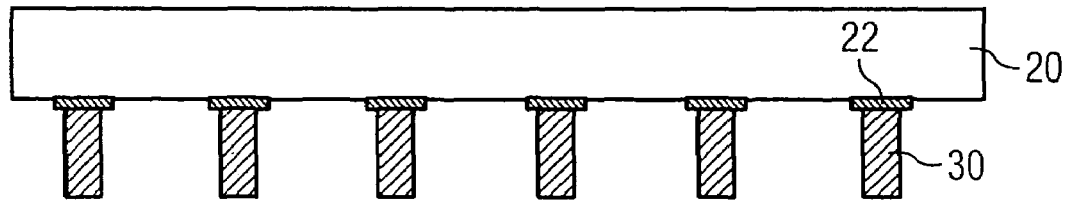
Figure 7E:
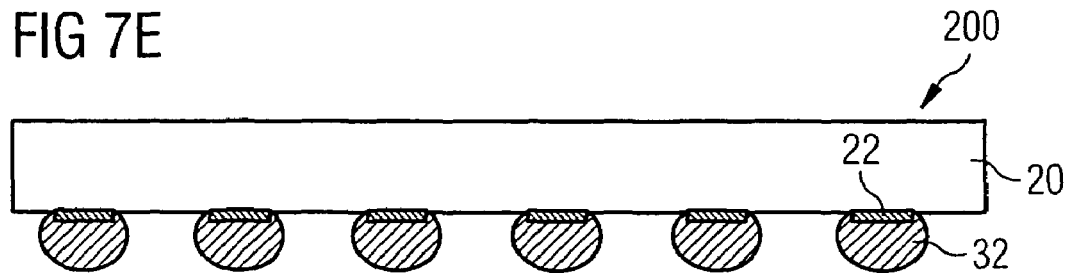

FIGS. 7A-7E show diagrammatic cross-sectional views of a method of forming a flip chip bump on an integrated circuit device 200 according to one embodiment of the present invention. A plurality of metallization pads 22, as shown in FIG. 7A, is formed on a die 20. A structured layer 24 having pores 26 is formed on the die 20 and metallization pads 22 as shown in FIG. 7B. Metal pillars 30, as shown in FIG. 7C, are formed according to the same method as described above in FIGS. 1-3B. Other alternative steps may also be subsequently performed on the die 20 when forming flip chip bumps as shown in FIGS. 7D-7E. For example, the inventive method may also include the steps of removing the structured layer 24 as shown in FIG. 7D. The structured layer 24 may be removed using stripping or etching processes such as wet/dry etching. FIG. 7E shows a solder sphere 32 on the metallization pad 22 formed by melting the metal pillar 30 to form the solder sphere 32. Solder spheres may be formed by any process used to form solder spheres such as a solder reflow process which generates a micro-sphere. The liquid metal and thus the metal pillars may comprise at lease one of the following materials: tin (Sn), lead (Pb), copper (Cu), silver (Ag), bismuth (Bi), indium (In), and antimony (Sb). For example in this step, the metal may comprise an alloy such as SnAgCu, SnAg, or SnPb.

FIGS. 8 shows a diagrammatic cross-sectional view of an integrated circuit device 200 according to one embodiment of the present invention. The flip chip bump structure on this integrated circuit device is formed according to the previous steps described above as shown in FIGS. 5A-5C or 6A-6C with alterations as described in the following steps. A plurality of metallization pads 22 is formed on a die 20. A structured layer 24 having pores 26 is formed on the die 20 and metallization pads 22. Additionally, the structured layer 24 is formed to have a free standing area 25 thereby exposing areas of the die without pads. Metal pillars 30 are formed according to the same method as described above in FIGS. 1-3B. Other alternative steps may also be subsequently performed on the die 20 when forming flip chip bumps. For example, the method may also include the steps of removing portions of the structured layer 24 such that a portion of the metal pillars 30 is exposed. The structured layer 24 may be removed using stripping or etching processes such as wet/dry etching. The inventive method thus may allow selective structuring of the flip chip bumps and include free standing areas 25 to accommodate various specification requirements.

FIG. 9 shows a diagrammatic cross-sectional view of an integrated circuit device 200 according to one embodiment of the present invention. The flip chip bump structure on this integrated circuit device is formed according to the previous steps described above as shown in FIGS. 5A-5C or 6A-6C with alterations as described in the following steps. A plurality of metallization pads 22 is formed on a die 20. A structured layer 24 having pores 26 is formed on the die 20 and metallization pads 22. Additionally, a second structured layer 27 having pores is formed on the first structured layer 24 such that the second structured layer pores are aligned with the first structure layer pores, thereby exposing the pads 22 through both sets of pores. The second structured layer pores have a different diameter than the first structure layer pores, for example a larger diameter and thus larger width 127.

Metal pillars 30 having two different diameters, such as a second diameter 32 greater than the first diameter of the metal pillars 30, are then formed according to the same method as described above in FIGS. 1-3B. Other alternative steps may also be subsequently performed on the die 20 when forming flip chip bumps. For example, the method may also include the steps of removing portions of the second structured layer 27 such that a portion of the metal pillars 30 are exposed. In this example, the portion having a second diameter 32 is exposed. The second structured layer 27 may be removed using stripping or etching processes such as wet/dry etching. The inventive method thus may allow not only selective structuring of the flip chip bumps but multiple structural layer depositions in order to control the metal pillar diameter at various points along the metal pillar, thereby accommodating various specification requirements and flip chip bump customization.

Figure 10A:
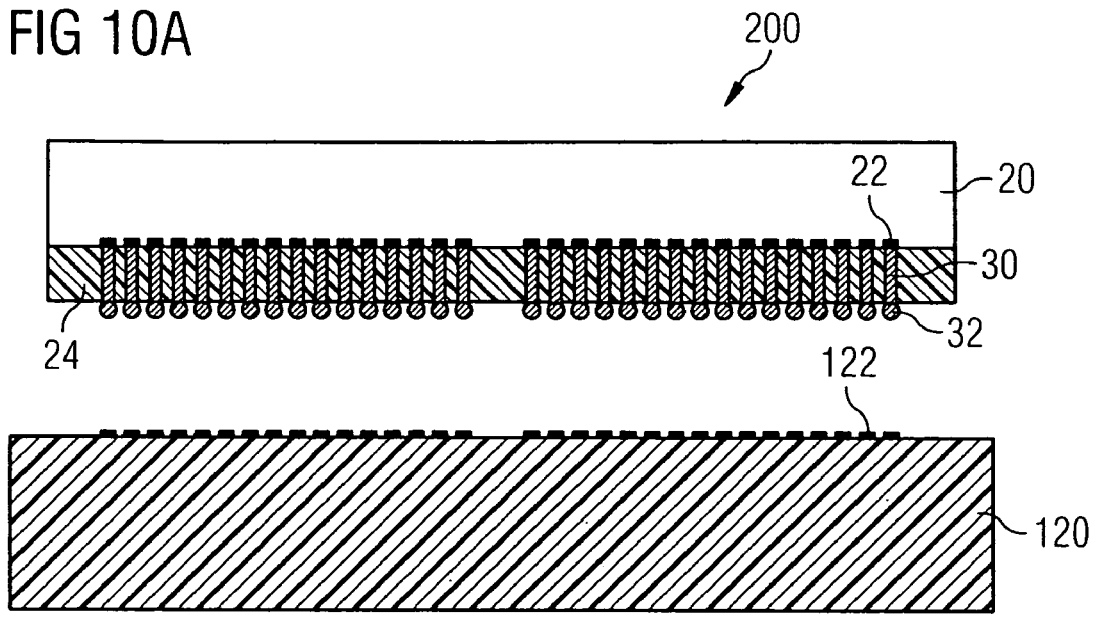
FIGS. 10A-10C show diagrammatic cross-sectional views of a method of assembling a semiconductor package according to one embodiment of the present invention.
Figure 10B:
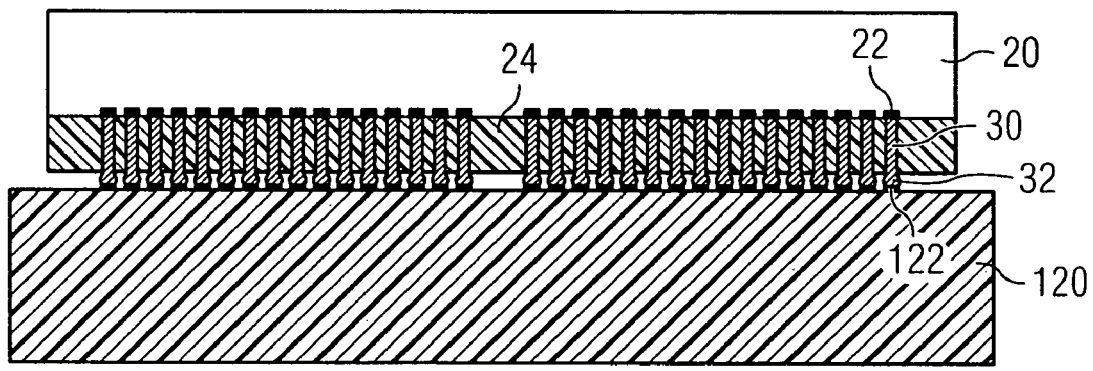
Figure 10C:
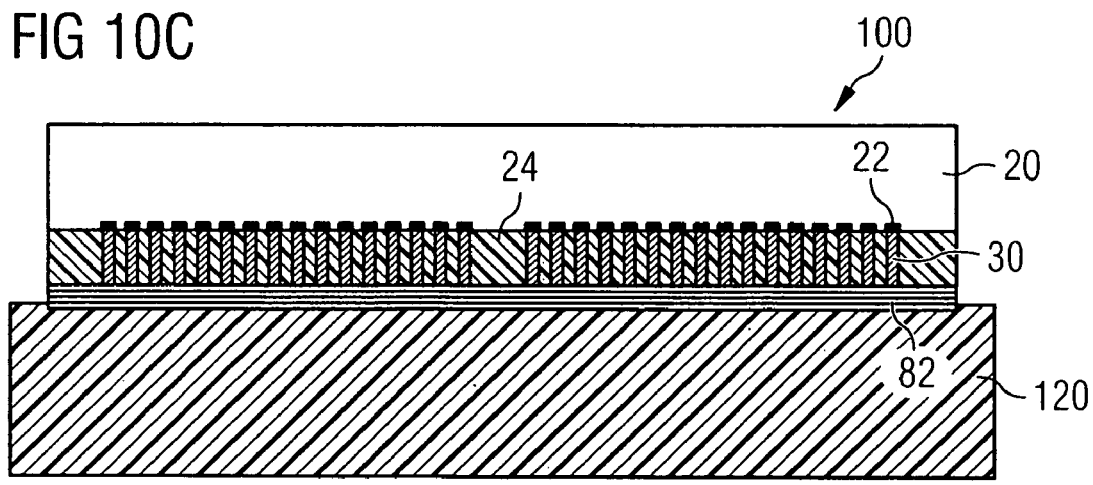

FIGS. 10A-10C show diagrammatic cross-sectional views of a method of assembling a semiconductor package according to one embodiment of the present invention. A method of assembling a semiconductor package is disclosed wherein the method includes steps as described in the following and according to the previous steps described above as shown in FIGS. 5A-5C or 6A-6C. In an initial step, a plurality of metallization pads 22 are formed on a die 20 of an integrated circuit device 200. In another step, a structured layer 24 having pores 26 is formed on the die 20 and metallization pads 22 where the pads on the die 20 are exposed through the pores 26. Metal pillars 30 are then formed according to the same method described above as shown in FIGS. 1-3B. In yet another step, the die 20 is transferred to a chamber 40 having a liquid metal bath 42. In another step, a first pressure is created within the chamber 40 followed by dipping the die 20 in the liquid metal bath 42. In another step, a second pressure is created within the chamber 40 such that liquid metal 44 fills portions of the pores 26 thereby forming metal pillars 30 connected to the pads 22. In another step, a solder sphere 32 is formed on an end of the metal pillar 30. In yet another step as shown in FIG. 10A, the die 20 is placed on a second component 120 having a plurality of metallization pads 122 such that the solder spheres 32 are aligned with the metallization pads 122 of the second component 120. In another step as shown in FIG. 10B, the solder spheres 32 are connected to the metallization pads 122 of the second component 120. Connecting the metal pillars 30 to the solder spheres 132 may be accomplished with various methods, one example of which is a reflow process.

Other steps in the process may include preheating the die to a desired temperature and planarizing the combined layer of metal pillars and structure layer before attaching the die 20 to a second component 120. The structured layer 24 may also be formed according to anther aspect of the invention though the individual steps are not shown in FIGS. 10A-10C. In an initial step, the structured layer 24 may be formed and defined by forming a layer of photosensitive material on the die 20 and metallization pads 22. Next, the layer of photosensitive material is exposed to radiation at predetermined areas corresponding to the pads 22 followed by removing portions of the layer that are exposed to radiation to form pores 26 in the layer, thereby exposing the pads 22 on the die 20 through the pores 26 as shown in FIG. 1. These steps may be performed using lithography, development or dry etch of the photosensitive material. The structured layer may comprise at least one of the following material epoxy based photoresist (e.g. Nano™SU-8 from Micro-Chem), polymer resist (e. g. THB-51N from JSR), silicone backbone resist, PMMA, benzocyclobutene (BCB) and silica.

Additionally, the solder spheres 32 on may be formed according to the steps as described above and shown in FIGS. 5D-5F or FIGS. 6D-6G. In another step, as shown in FIG. 10C, a liquid underfill 82 may be formed between the die 20 and the second component 120 when assembling the semiconductor package 100.

Figure 11:
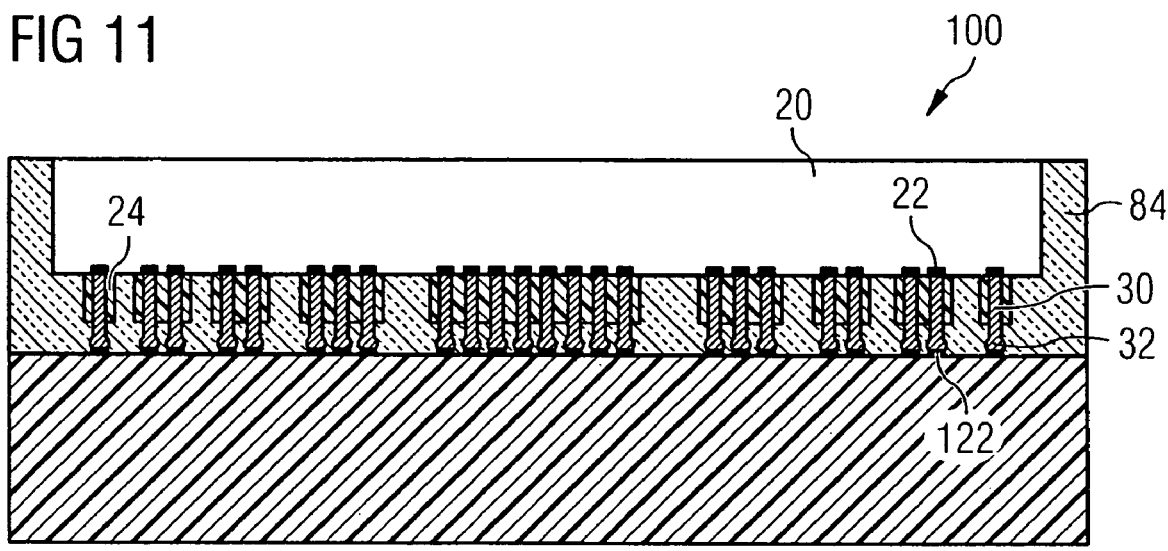
FIG. 11 shows a diagrammatic cross-sectional view of a semiconductor package according to one embodiment of the present invention.

FIGS. 11 shows a diagrammatic cross-sectional view of a semiconductor package 100 according to one embodiment of the present invention. A method of assembling a semiconductor package is disclosed wherein the method includes steps as described in the following and according to the previous steps described above as shown in FIGS. 5A-5C or 6A-6C. In an initial step, a plurality of metallization pads 22 are formed on a die 20 of an integrated circuit device 200. In another step, a structured layer 24 having pores 26 is formed on the die 20 and metallization pads 22 where the pads on the die 20 are exposed through the pores 26. Metal pillars 30 are then formed according to the same method described above as shown in FIGS. 1-3B. In yet another step, the die 20 is transferred to a chamber 40 having a liquid metal bath 42. In another step, a first pressure is created within the chamber 40 followed by dipping the die 20 in the liquid metal bath 42. In another step, a second pressure is created within the chamber 40 such that liquid metal 44 fills portions of the pores 26 thereby forming metal pillars 30 connected to the pads 22.

In another step, portions of the structured layer 24 are removed such that both a portion of the metal pillars 30 is exposed. In yet another step, the die 20 is placed on a second component 120 having a plurality of metallization pads 122 such that the metal pillars 30 are aligned with the metallization pads 122 of the second component 120. In another step, the metal pillars 30 are connected to the metallization pads 122 of the second component 120. Connecting the metal pillars 30 to the metallization pads 122 of the second component 120 may be accomplished with various methods, one example of which is a reflow process. The specific definition of the structured layer may be formed according to any of the methods previously described. FIG. 11 shows a structured layer having free standing areas as described above and shown in FIG. 8. In another step, an undermold 84 may be formed between the die 20 and the second component 120 when assembling the semiconductor package 100. Alternative packing may include encapsulating the die or forming a liquid underfill as previously described.

The metal used to make the metal pillars in any of the above semiconductor packages, flip chip solder bumps, or integrated circuit devices may comprise at least one of the following materials: tin (Sn), lead (Pb), copper (Cu), silver (Ag), bismuth (Bi), indium (In), and antimony (Sb). The metallization pads may comprise at least one of the following materials: copper (Cu), nickel (Ni), gold, (Au), and aluminum (Al). Additionally, The structured layer may comprise at least one of the following materials: epoxy based photoresist (e.g. Nano™SU-8 from Micro-Chem), polymer resist (e. g. THB-51N from JSR), silicone backbone resist, PMMA, benzocyclobutene (BCB) and silica. Furthermore, the aspect ratio of the metal pillars used to connect the two components in the semiconductor package may be at least about 1, at least about 5, or at least about 10. In any of the above semiconductor packages, the second component may comprise a substrate or another die.

It is believed that one advantage of the present invention is the ability to form fine pitch solder bumps with high aspect ratios. The increasing demand for integrated typically requires much more dense interconnects between chip and substrate and chip to chip as well. The present invention may allow a decreased risk of shorts between bumps during fabrication, especially with fine pitch interconnects, and reduce reflow requirements. Moreover, the present invention may allow larger standoff benefiting an underfill process. Less restrictions for underfill materials, for example small filler size, or process, such as capillary underfilling and underfill molding, may exist. Additionally, due to the larger standoff (higher aspect ratio) possibly available with the present invention, stress at the chip/bump interface may be reduced because of the higher flexibility of the interconnect element. The may become particularly important when fragile low-k interlayer dielectrics or ILDs are used.

Moreover, the invention may be implemented at a low cost with minimal alterations and additions in capital equipment and technology employed in semiconductor fabs. Shorter process times than conventional electroplating technologies may also be permitted with the present invention. Very high uniformity of 300 mm wafer may be possible because the liquid pore filling process is independent of pillar diameter or height. Using solder as a pillar interconnect material may allow no restrictions to binary or tertiary metal combinations as in the case of electroplating. The very fine pitches that may be possible with the present invention are only limited by the photolithography process that may form the structured layer and not by the electroplating process. Likewise, a very fine pillar diameter at large aspect ratio may be possible which increase mechanical flexibility of the interconnect element.

The preceding description only describes advantageous exemplary embodiments of the invention. The features disclosed therein and the claims and the drawings can therefore be essential for the realization of the invention in its various embodiments both individually and in combination. While the foregoing is directed to embodiments of the present invention, other and further embodiments of this invention may be devised without departing from the basic scope of the invention. The scope of the present invention being determined by the claims as follows.

What is claimed is:

1. A method of forming a flip chip bump, the method comprising:
    forming a plurality of metallization pads on a die;
    forming a structured layer having pores on the die and metallization pads, thereby exposing the pads on the die through the pores;
    transferring the die to a chamber having a liquid metal bath therein;
    creating a first pressure within the chamber;
    dipping the die in the liquid metal bath; and
    creating a second pressure within the chamber such that liquid metal fills portions of the pores thereby forming metal pillars connected to the pads.

2. The method of claim 1 further comprising removing the structured layer.

3. The method of claim 1 further comprising preheating the semiconductor to a desired temperature.

4. The method of claim 1 further comprising:
    removing portions of the structured layer such that a portion of the metal pillars is exposed; and
    forming a solder sphere from the exposed portion of the metal pillars.

5. The method of claim 1 further comprising:
    forming a low melting point solder cap on the metal pillars;
    melting the solder cap to form a solder sphere; and
    removing the structured layer.

6. The method of claim 1 further comprising:
    removing the structured layer; and
    melting the metal pillar to form a solder sphere on the metallization pad.

7. The method of claim 1 further comprising:
    forming the structured layer to have a free standing area thereby exposing areas of the die without pads; and
    removing portions of the structured layer such that a portion of the metal pillars is exposed.

8. The method of claim 1 further comprising:
    forming a second structured layer having pores on the first structured layer such that the second structured layer pores are aligned with the first structured layer pores, thereby exposing the pads on the die through both sets of pores, the second structured layer pores having a different diameter than the first structured layer pores; and
    removing a portion of the second structured layer such that a portion of the metal pillars is exposed.

9. The method of claim 1 further comprising planarizing the combined layer of metal pillars and structured layer.

10. The method of claim 1 wherein the metal comprises at least one of the following materials: tin (Sn), lead (Pb), copper (Cu), silver (Ag), bismuth (Bi), indium (In), and antimony (Sb).

11. The method of claim 1 wherein the metallization pads comprise at least one of the following materials: copper (Cu), nickel (Ni), gold, (Au), and aluminum (Al).

12. The method of claim 1 wherein the structured layer comprises at least one of the following materials: SU-8, epoxy, silicone, silica epoxy based photoresist, polymer resist, silicone backbone resist, PMMA, benzocyclobutene and silica.

13. The method of claim 1 wherein the forming the structured layer step comprises:
    forming a layer of photosensitive material on the die and metallization pads;
    exposing the layer of photosensitive material to radiation at predetermined areas corresponding to the pads; and
    removing portions of the layer that are exposed to radiation to form pores in the layer, thereby exposing the pads on the die through the pores.

14. The method of claim 1 wherein the aspect ratio of the metal pillars is at least about 1.

15. The method of claim 1 wherein the aspect ratio of the metal pillars is at least about 5.

16. The method of claim 1 wherein the aspect ratio of the metal pillars is at least about 10.

17. The method of claim 1 wherein the die comprises at least one of the following materials: semiconductor, glass, ceramic, and polymer.

18. A method of assembling a semiconductor package, the method comprising:
    forming a plurality of metallization pads on a die;
    forming a structured layer having pores on the die and metallization pads, thereby exposing the pads on the die through the pores;
    transferring the die to a chamber having a liquid metal bath therein;
    creating a first pressure within the chamber;
    dipping the die in the liquid metal bath;
    creating a second pressure within the chamber such that liquid metal fills portions of the pores thereby forming metal pillars connected to the pads;
    removing at least a portion of the structured layer;
    placing the die on a second component having a respective solder depot on each of a plurality of metallization pads such that the pillars are aligned with the solder depots; and
    connecting the pillars to the solder depots.

19. The method of claim 18 further comprising preheating the die to a desired temperature.

20. The method of claim 18 further comprising planarizing the combined layer of metal pillars and structured layer.

21. The method of claim 18 wherein the forming the structured layer step comprises:
    forming a layer of photosensitive material on the die and metallization pads;
    exposing the layer of photosensitive material to radiation at predetermined areas corresponding to the pads; and
    removing portions of the layer that are exposed to radiation to form pores in the layer, thereby exposing the pads on the die through the pores.

22. The method of claim 18 further comprising planarizing the combined layer of metal pillars and structured layer.

23. The method of claim 21 further comprising encapsulating the die.

24. The method of claim 18 further comprising forming an undermold between the die and the second component.

25. The method of claim 18 further comprising forming a liquid underfill between the die and the second component.

26. The method as in claim 18 wherein the second component comprises a substrate.

27. The method as in claim 18 where in the second component comprises a die.

28. The method of claim 18 wherein the metal comprises at least one of the following materials: tin (Sn), lead (Pb), copper (Cu), silver (Ag), bismuth (Bi), indium (In), and antimony (Sb).

29. The method of claim 18 wherein the metallization pads comprise at least one of the following materials: copper (Cu), nickel (Ni), gold, (Au), and aluminum (Al).

30. The method of claim 18 wherein the structured layer comprises at least one of the following materials: epoxy based photoresist, polymer resist, silicone backbone resist, PMMA, benzocyclobutene (BCB) and silica.

31. The method of claim 18 wherein the aspect ratio of the metal pillars is at least about 1.

32. The method of claim 18 wherein the aspect ratio of the metal pillars is at least about 5.

33. The method of claim 18 wherein the aspect ratio of the metal pillars is at least about 10.

34. The method of claim 1 wherein the die comprises at least one of the following materials: semiconductor, glass, ceramic, and polymer.

35. A method of assembling a semiconductor package, the method comprising:
    forming a plurality of metallization pads on a die;
    forming a structured layer having pores on the die and metallization pads, thereby exposing the pads on the die through the pores;
    transferring the die to a chamber having a liquid metal bath therein;
    creating a first pressure within the chamber;
    dipping the die in the liquid metal bath;
    creating a second pressure within the chamber such that liquid metal fills portions of the pores thereby forming metal pillars connected to the pads;
    forming a respective solder sphere on an end of each of the metal pillars;
    placing the die on a second component having a plurality of metallization pads such that the solder spheres are aligned with the metallization pads of the second component; and
    connecting the solder spheres to the metallization pads of the second component.

36. The method of claim 35 further comprising preheating the die to a desired temperature.

37. The method of claim 35 wherein the forming the structured layer step comprises:
    forming a layer of photosensitive material on the die and metallization pads;
    exposing the layer of photosensitive material to radiation at predetermined areas corresponding to the pads; and
    removing portions of the layer that are exposed to radiation to form pores in the layer, thereby exposing the pads on the die through the pores.

38. The method of claim 35 wherein the forming a solder sphere step comprises:
    removing portions of the structured layer such that a portion of the metal pillars is exposed; and
    forming a solder sphere on an end of the exposed metal pillars.

39. The method of claim 35 wherein the forming a solder sphere step comprises:
    forming a low melting point solder cap on the metal pillars; and
    melting the solder cap to form a solder sphere.

40. The method of claim 35 further comprising planarizing the combined layer of metal pillars and structured layer.

41. The method of claim 35 further comprising encapsulating the die.

42. The method of claim 35 further comprising forming an undermold between the die and the second component.

43. The method of claim 35 further comprising forming a liquid underfill between the die and the second component.

44. The method as in claim 35 wherein the second component comprises a substrate.

45. The method as in claim 35 wherein the second component comprises a die.

46. The method of claim 35 wherein the metal comprises at least one of the following materials: tin (Sn), lead (Pb), copper (Cu), silver (Ag), bismuth (Bi), indium (In), and antimony (Sb).

47. The method of claim 35 wherein the metallization pads comprise at least one of the following materials: copper (Cu), nickel (Ni), gold, (Au), and aluminum (Al).

48. The method of claim 35 wherein the structured layer comprises at least one of the following materials: epoxy based photoresist, polymer resist, silicone backbone resist, PMMA, benzocyclobutene and silica.

49. The method of claim 35 wherein the aspect ratio of the metal pillars is at least about 1.

50. The method of claim 35 wherein the aspect ratio of the metal pillars is at least about 5.

51. The method of claim 35 wherein the aspect ratio of the metal pillars is at least about 10.

52. The method of claim 35 wherein the die comprises at least one of the following materials: semiconductor, glass, ceramic, and polymer.

53. A method of assembling a semiconductor package, the method comprising:
    forming a plurality of metallization pads on a die;
    forming a structured layer having pores on the die and metallization pads thereby exposing the pads on the die through the pores;
    transferring the die to a chamber having a liquid metal bath therein;
    creating a first pressure within the chamber;
    dipping the die in the liquid metal bath;
    creating a second pressure within the chamber such that liquid metal fills portions of the pores thereby forming metal pillars connected to the pads;
    removing portions of the structured layer such that a portion of the metal pillars is exposed;
    placing the die on a second component having a plurality of metallization pads such that the metal pillars are aligned with the metallization pads of the second component; and
    connecting the metal pillars to the metallization pads of the second component.

54. The method of claim 53 further comprising preheating the die to a desired temperature.

55. The method of claim 53 wherein the forming the structured layer step comprises:
    forming a layer of photosensitive material on the die and metallization pads;
    exposing the layer of photosensitive material to radiation at predetermined areas corresponding to the pads; and
    removing portions of the layer that are exposed to radiation to form pores in the layer, thereby exposing the pads on the die through the pores.

56. The method of claim 53 further comprising planarizing the combined layer of metal pillars and structured layer.

57. The method of claim 53 further comprising encapsulating the die.

58. The method of claim 53 further comprising forming an undermold between the die and the second component.

59. The method of claim 53 further comprising forming a liquid underfill between the die and the second component.

60. The method of claim 53 wherein the second component comprises a substrate.

61. The method of claim 53 wherein in the second component comprises a die.

62. The method of claim 53 wherein the metal comprises at least one of the following materials: tin (Sn), lead (Pb), copper (Cu), silver (Ag), bismuth (Bi), indium (In), and antimony (Sb).

63. The method of claim 53 wherein the metallization pads comprise at least one of the following materials: copper (Cu), nickel (Ni), gold, (Au), and aluminum (Al).

64. The method of claim 53 wherein the structured layer comprises at least one of the following materials: epoxy based photoresist, polymer resist, silicone backbone resist, PMMA, benzocyclobutene and silica.

65. The method of claim 53 wherein the aspect ratio of the metal pillars is at least about 1.

66. The method of claim 53 wherein the aspect ratio of the metal pillars is at least about 5.

67. The method of claim 53 wherein the aspect ratio of the metal pillars is at least about 10.

68. The method of claim 53 further comprising:
forming the structured layer to have a free standing area thereby exposing areas of the die without pads.

69. The method of claim 53 further comprising:
forming a second structured layer having pores on the first structured layer such that the second structured layer pores are aligned with the first structured layer pores, thereby exposing the pads on the die through both sets of pores, the second structured layer pores having a different diameter than the first structured layer pores; and
removing portions of the second structured layer such that a portion of the metal pillars is exposed.

70. The method of claim 53 wherein the die comprises at least one of the following materials: semiconductor, glass, ceramic, and polymer.

* * * * *